United States Patent
D'Incà et al.

(10) Patent No.: US 12,309,961 B2
(45) Date of Patent: May 20, 2025

(54) SYSTEM FOR RACK MOUNTABLE ELECTRONIC DEVICES

(71) Applicant: Telefonaktiebolaget LM Ericsson (publ), Stockholm (SE)

(72) Inventors: Claudio D'Incà, Genoa (IT); Marco Assale, Genoa (IT); Sergio Mosti, Genoa (IT); Sergio Lanzone, Genoa (IT)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 195 days.

(21) Appl. No.: 18/253,663

(22) PCT Filed: Nov. 25, 2020

(86) PCT No.: PCT/EP2020/083433
§ 371 (c)(1),
(2) Date: May 19, 2023

(87) PCT Pub. No.: WO2022/111805
PCT Pub. Date: Jun. 2, 2022

(65) Prior Publication Data
US 2024/0008211 A1    Jan. 4, 2024

(51) Int. Cl.
*H05K 7/14*    (2006.01)
(52) U.S. Cl.
CPC ................. *H05K 7/1489* (2013.01)
(58) Field of Classification Search
CPC ............ H05K 7/1489; H05K 7/1491
See application file for complete search history.

(56) References Cited

U.S. PATENT DOCUMENTS

| | | | | |
|---|---|---|---|---|
| 5,791,498 A * | 8/1998 | Mills | ............ | H02B 1/34 |
| | | | | 211/183 |
| 6,021,909 A * | 2/2000 | Tang | ............ | H05K 7/1421 |
| | | | | 211/183 |
| 6,431,668 B1 * | 8/2002 | Reddicliffe | ............ | A47B 88/43 |
| | | | | 312/334.1 |
| 6,435,354 B1 * | 8/2002 | Gray | ............ | H05K 7/1491 |
| | | | | 211/26 |
| 7,097,047 B2 * | 8/2006 | Lee | ............ | H05K 7/1491 |
| | | | | 361/825 |

(Continued)

*Primary Examiner* — Anthony M Haughton
*Assistant Examiner* — Hung Q Dang
(74) *Attorney, Agent, or Firm* — Murphy, Bilak & Homiller, PLLC

(57) ABSTRACT

In A system for mounting an electronic device on a device rack is provided. The device rack is for supporting a plurality of the electronic devices spaced along the rack in a first direction of the system. The system comprises: the electronic device; and a bracket for mounting the electronic device in a device rack, the bracket comprising: a first coupler configured to couple the bracket to the electronic device; a second coupler configured to couple the bracket to the device rack; and a bracket body comprising: a first arm extending between the first coupler and the second coupler; and a second arm extending between the first coupler and the second coupler, wherein the first arm and second arm are spaced apart to define an opening through which one or more cables and/or fibres connected to the electronic device can extend.

20 Claims, 5 Drawing Sheets

(56) References Cited

U.S. PATENT DOCUMENTS

| | | | | |
|---|---|---|---|---|
| 8,965,168 | B2 * | 2/2015 | Cowen | G02B 6/4455 |
| | | | | 385/135 |
| 9,038,832 | B2 * | 5/2015 | Hernandez-Ariguznaga | ............... |
| | | | | H05K 7/186 |
| | | | | 211/26 |
| 9,281,676 | B2 * | 3/2016 | Chen | H05K 7/1491 |
| 10,356,931 | B1 * | 7/2019 | Chen | A47B 96/061 |
| 11,968,796 | B2 * | 4/2024 | Zhan | G06F 1/183 |
| 2014/0097000 | A1 | 4/2014 | Lin et al. | |
| 2019/0075676 | A1 | 3/2019 | Anderson et al. | |

* cited by examiner

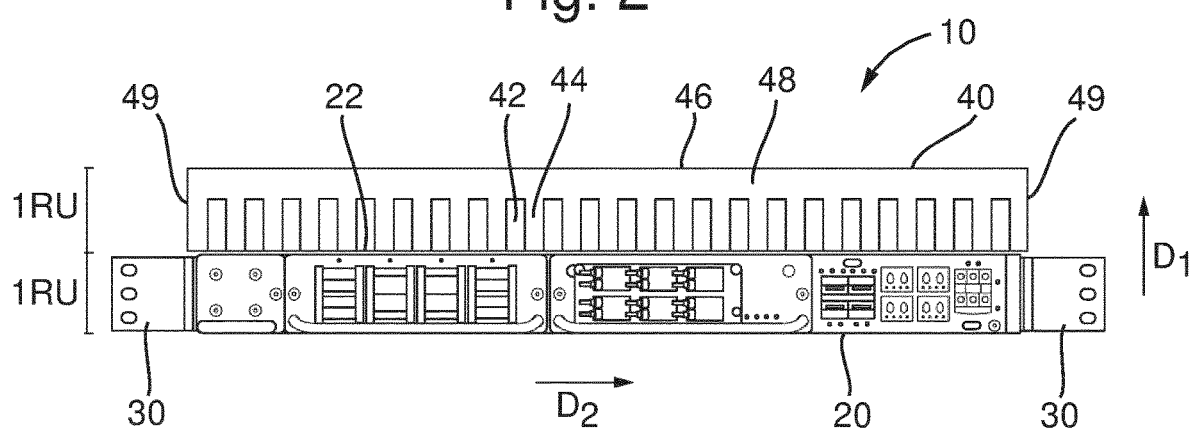
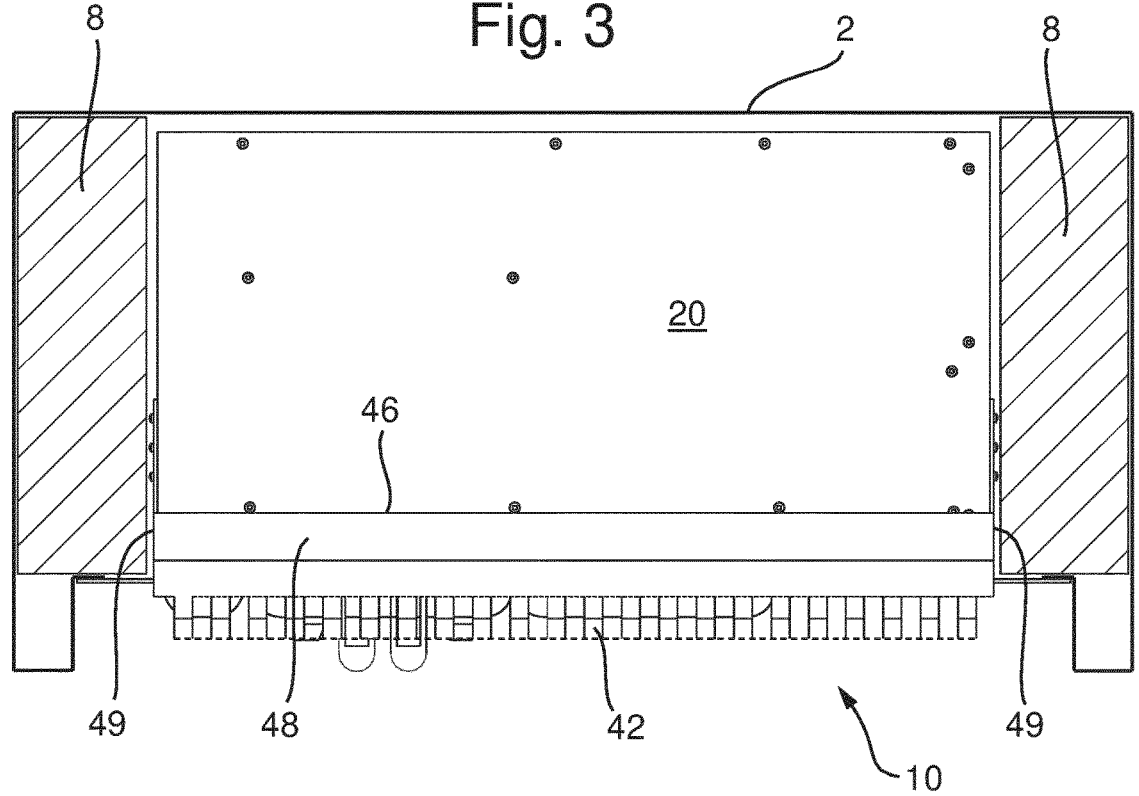

SYSTEM FOR RACK MOUNTABLE ELECTRONIC DEVICES

TECHNICAL FIELD

The present disclosure relates to systems for rack mountable electronic devices and is particularly, although not exclusively, concerned with a system for mounting an electronic device on a device rack such that a space requirement of the electronic device within the device rack is reduced.

BACKGROUND

Electronic devices, e.g. rack mountable electronic devices, are often mounted on a device rack with standard dimensions, such as an ETSI or ANSI device rack. With reference to FIGS. 1a and 1b, such device racks 2 typically extend in a longitudinal direction DL and are designed to enable a plurality of the rack mountable electronic devices to be mounted on the rack, spaced apart from one another in the longitudinal direction DL of the rack.

The device rack 2 comprises a plurality of coupling points 6, such as fastener openings, spaced along one or more coupling surfaces 4 of the device rack 2. As shown in FIGS. 1a and 1b, coupling surfaces 4 are provided at each lateral side of the device rack 2 and extend along the device rack in the longitudinal direction DL. The coupling points 6 are spaced along the coupling surfaces 4 in the longitudinal direction DL, thereby enabling the electronic devices to be mounted on the rack at a desired position in the longitudinal direction of the device rack 2.

Each of the electronic devices to be mounted on the device rack may be coupled to one or more of the coupling points 6 at each lateral side of the device rack to support the electronic device on the rack. The number of coupling points used for coupling each electronic device to the device rack may depend, for example, on a dimension of the electronic device in the longitudinal direction DL of the rack and a support requirement of the electronic device.

With reference to FIGS. 2 and 3, a previously proposed device mounting system 10 for mounting an electronic device 20 on a device rack, such as the standard device rack 2, comprises the electronic device 20, a pair of previously proposed brackets 30 and a cable routing body 40. The brackets 30 are coupled to opposing lateral sides of the electronic device 20 and are to be coupled to the coupling points 6 on the coupling surfaces 4 provided at respective lateral sides of the device rack 2 in order to mount the electronic device 20 on the device rack 2.

A dimension, e.g. height, of an electronic device to be mounted on a standard device rack, in a first, e.g. longitudinal, direction $D_1$ of the electronic device or the device mounting system that is to be aligned with the longitudinal direction DL of the device rack, may be measured in terms of standard "rack units" (RU). As illustrated, the electronic device 20 depicted in FIGS. 2 and 3 has a dimension in the first direction $D_1$ of one rack unit.

As shown in FIG. 2, the cable routing body 40 may be coupled to the electronic device 20, e.g. to an first surface 22 of the electronic device, such that the cable routing body 40 is arranged to one side of the electronic device in the first direction $D_1$. The cable routing body 40 comprises a base portion 46 shaped to define a cable routing channel 48 that extends across the device mounting system 10 in a second, e.g. lateral, direction $D_2$. As depicted, the second direction $D_2$ may be perpendicular to the first direction $D_1$. The cable routing channel 48 provides space for cables and/or fibres to be routed along the cable routing body 40 to openings 49 at the lateral sides of the device mounting system 10.

As shown in FIG. 3, the device rack 2 may form one or more cable routing areas 8 at the lateral sides of the rack for cables and/or fibres to be routed in the longitudinal direction DL of the rack, e.g. between different ones of the electronic devices mounted on the rack or out of the device rack.

The cable routing body 40 further comprises a plurality of cable routing projections 42 spaced along the cable routing body 40 in the second direction $D_2$ of the device mounting system 10. The cable routing projections 42 define a plurality of cable routing spaces 44 extending in the first direction $D_1$ between adjacent pairs of the cable routing projections 42 for cables and/or fibres to be routed from the electronic device in the first direction $D_1$.

The base portion 46 of the cable routing body may have an open side adjacent to the cable routing projections 42, allowing cables and/or fibres, which have been routed between the cable routing projections 42 to be further routed into the cable routing channel and then along the cable routing channel 48 to the lateral sides of the device mounting system 10. In this way, the cable routing body 40 may facilitate organisation and stabilisation of cables and/or fibres connected to the electronic device 20 and their routing towards the cable routing areas 8 of the device rack.

As depicted in FIGS. 2, a dimension of the cable routing body 40 in the first direction $D_1$ of the device mounting system 10 is approximately equal to the dimension of the electronic device, e.g. one rack unit. Accordingly, a total dimension of the device mounting system 10 in the first direction $D_1$ is two rack units.

SUMMARY

According to an aspect of the present disclosure, there is provided a system for mounting an electronic device on a device rack. The device rack is for supporting a plurality of the electronic devices spaced along the rack in a first, e.g. longitudinal, direction of the system. The system comprises: the electronic device; and a bracket for mounting the electronic device in a device rack. The bracket comprises: a first coupler, e.g. flange, configured to couple the bracket to the electronic device; a second coupler, e.g. flange, configured to couple the bracket to the device rack. The bracket body comprises: a first arm extending between the first coupler and the second coupler; and a second arm extending between the first coupler and the second coupler. The first arm and second arm are spaced apart to define an opening through which one or more cables and/or fibres connected to the electronic device can extend.

The first and second arms may be spaced apart from one another in the first direction. The opening may be formed between the first and second arms.

The first and second arms may comprise plates disposed in one or more planes perpendicular to the first direction. The bracket body may extend between the first and second couplers in a second, e.g. lateral, direction. The second direction may be perpendicular to the first direction. A portion of the bracket body may extend beyond one side, e.g. forwards, of the first and second couplers in a third, e.g. depth, direction of the system. The third direction may be perpendicular to the first and second directions. For example, the first and second arms of the bracket body may extend beyond the one side, e.g. forwards, of the first and second couplers in the third direction.

The bracket body may be connected to the first and second couplers such that a structural load path defined by the bracket body between the first and second couplers extends beyond the one side, e.g. forwards, of the first and second couplers in the third direction. In other words, the bracket body may be connected to the first and second couplers such that no structural load path is provided between the first and second couplers that does not extend beyond the one side, e.g. forwards, of the first and second couplers in the third direction.

The bracket body may comprise a vibration damping portion configured, e.g. shaped, to damp vibrations of the electronic device relative to the device rack and/or of the device rack relative to the electronic device, e.g. in the second direction. The vibration damping portion may be configured, e.g. shaped, to reduce the amplitude of loads transmitted from the electronic device to the device rack and/or from the device rack to the electronic device, e.g. in the second direction.

The vibration damping portion may comprise a portion of the bracket body having a curved profile in a cross-section in a plane perpendicular to the first direction. The vibration damping portion of the bracket body may extend through an angle of greater than 90 degrees. For example, the portion of the bracket body may extend through an angle of approximately 180 degrees.

The bracket body may comprise one or more further vibration damping portions configured, e.g. shaped, to damp vibrations of the electronic device relative to the device rack and/or of the device rack relative to the electronic device in a direction perpendicular to the direction in which the vibration damping portions damp vibrations, e.g. in the first direction. The further vibration damping portions may be configured, e.g. shaped, to reduce the amplitude of loads transmitted from the electronic device to the device rack and/or from the device rack to the electronic device, e.g. in the first direction. The further vibration damping portions may comprise one or more portions of the bracket body having a curved profile in a cross-section in a plane parallel with the first direction.

The first coupler may comprise separate first and second coupler portions for coupling to the electronic device at positions spaced apart from one another in the first direction. A side opening may be formed between the first and second coupler portions to permit a flow of air in a direction perpendicular to the first direction, e.g. in the second direction, to and/or from the electronic device, e.g. for cooling an actively cooled electronic device. The first coupler portion may be connected to the first arm and the second coupler portion may be connected to the second arm.

According to another aspect of the present disclosure, there is provided a system for mounting an electronic device on a device rack. The device rack is for supporting a plurality of the electronic devices spaced along the rack in a first, e.g. longitudinal, direction of the system. The system comprises: the electronic device; and a bracket. The bracket comprises: a first coupler, e.g. flange, coupled to a surface of the electronic device; a second coupler, e.g. flange, for coupling to the device rack; and a bracket body comprising one or more arms extending between the first and second couplers. A dimension of the bracket body, e.g. of one or more of the arms, in the first direction is less than a dimension of at least one of the first and second couplers in the first direction, such that an opening is formed between the electronic device and the second coupler for one or more cables and/or fibres to be routed between the electronic device and the device rack. The opening is aligned with the electronic device in the first direction, e.g. such that a dimension of the opening in the first direction overlaps with a dimension of the first and/or second flanges in the first direction.

According to another aspect of the present disclosure, there is provided a bracket for mounting electronic device on a rack, e.g. for the above-mentioned system. The bracket comprises: a first coupler, e.g. flange, for coupling to a surface of the electronic device; a second coupler, e.g. flange, for coupling to the rack; and a bracket body extending between the first and second couplers. The bracket body has a dimension in the first direction which is less than a dimension of at least one of the first and second couplers in the first direction, such that an opening is formed between the electronic device and the second coupler for one or more cables and/or fibres to be routed between the electronic device and the device rack. The opening is at least partially aligned with at least one of the first and second coupler in the first direction.

According to another aspect of the present disclosure, there is provided a bracket for mounting a electronic device on a device rack, e.g. for the above-mentioned system.

The bracket comprises: a first coupler configured to couple the bracket to the electronic device; a second coupler configured to couple the bracket to the device rack; and a bracket body. The bracket body comprises: a first arm extending between the first coupler and the second coupler; and a second arm extending between the first coupler and the second coupler. The first arm and the second arm are spaced apart to define an opening through which one or more cables and/or fibres connected to the electronic device can extend.

According to another aspect of the present disclosure, there is provided a method of fitting an electronic device on a device rack. The method comprises: coupling the above-mentioned bracket to the electronic device; mounting the electronic device on the device rack using the bracket; and routing one or more cables and/or fibres to be connected to the electronic device through the opening defined by the bracket, e.g. between the first and second arms of the bracket.

The method may be a method of retrofitting the electronic device on the device rack. The device rack may be for supporting a plurality of the electronic devices spaced along the rack in a first, e.g. longitudinal, direction. The method may further comprise: decoupling a cable routing body from the electronic device, the cable routing body defining an opening for routing cables and/or fibres through a space offset, or spaced apart, from the electronic device in the first direction.

The method may further comprise mounting a further electronic device on the device rack, such that the further electronic device is at least partially within the space offset, or spaced apart, from the electronic device in the first direction.

To avoid unnecessary duplication of effort and repetition of text in the specification, certain features are described in relation to only one or several aspects or embodiments of the invention. However, it is to be understood that, where it is technically possible, features described in relation to any aspect or embodiment of the invention may also be used with any other aspect or embodiment of the invention.

BRIEF DESCRIPTION OF THE DRAWINGS

For a better understanding of the present invention, and to show more clearly how it may be carried into effect, reference will now be made, by way of example, to the accompanying drawings, in which:

FIG. 2 is a front view of a previously proposed device mounting system for mounting an electronic device on a device rack;

FIG. 3 is a top view of the device mounting system shown in FIG. 2 coupled to the device rack shown in FIG. 1;

DETAILED DESCRIPTION

Figure 1A:
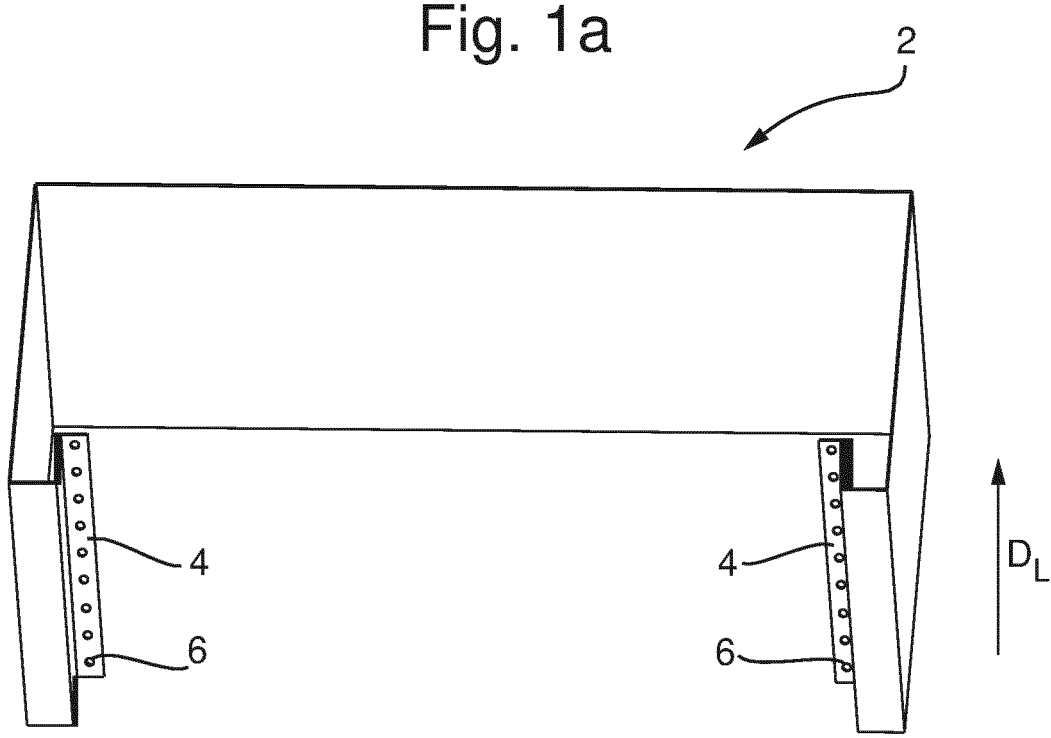
FIGS. 1a and 1b, collectively referred to as FIG. 1, are perspective and cross-sectional views respectively of a standard device rack for mounting electronic devices.
Figure 1B:
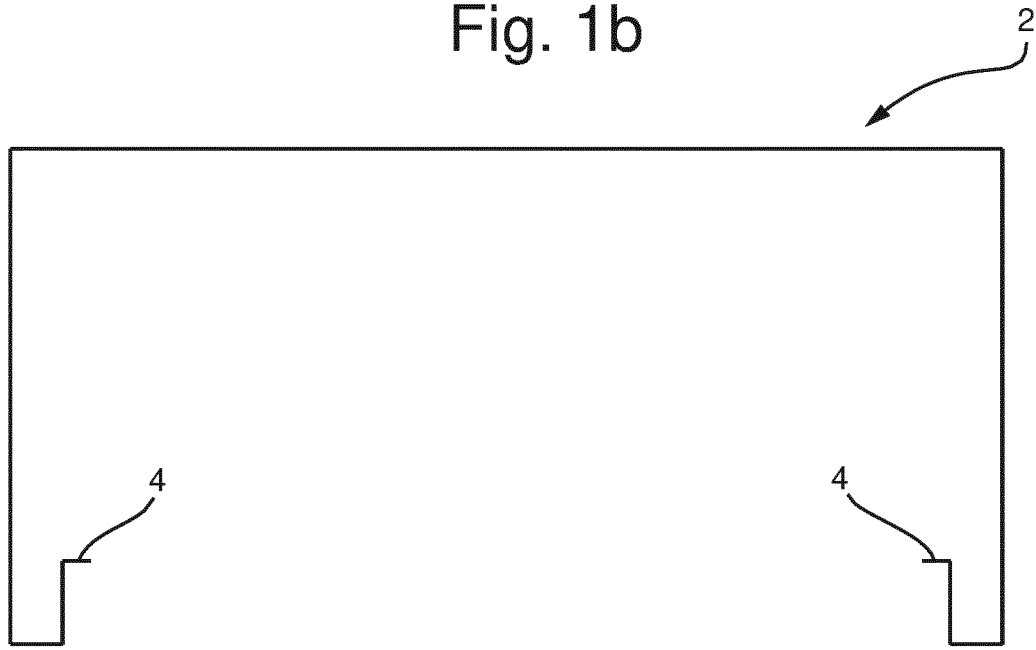
Figure 4:
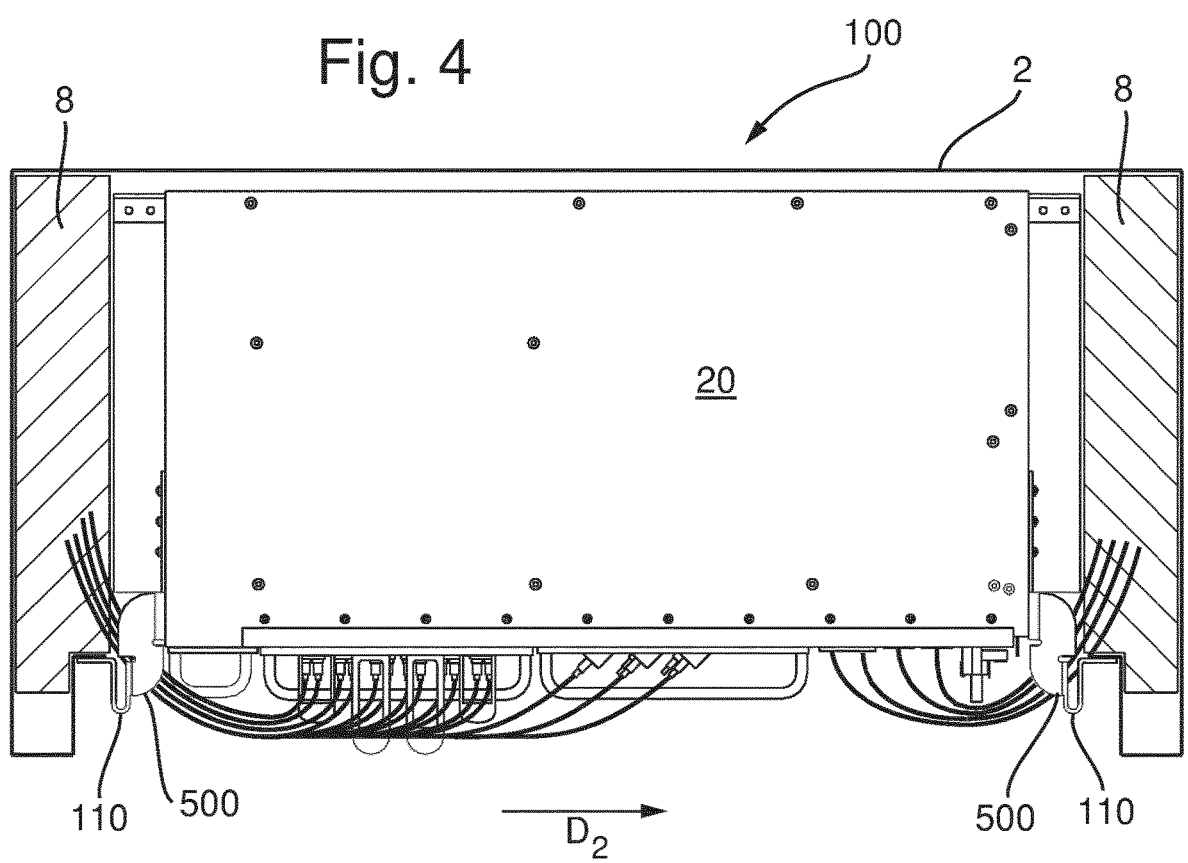
FIG. 4 is a top view a device mounting system according to the present disclosure coupled to the device rack shown in FIGS. 1a and 1b.
Figure 5:
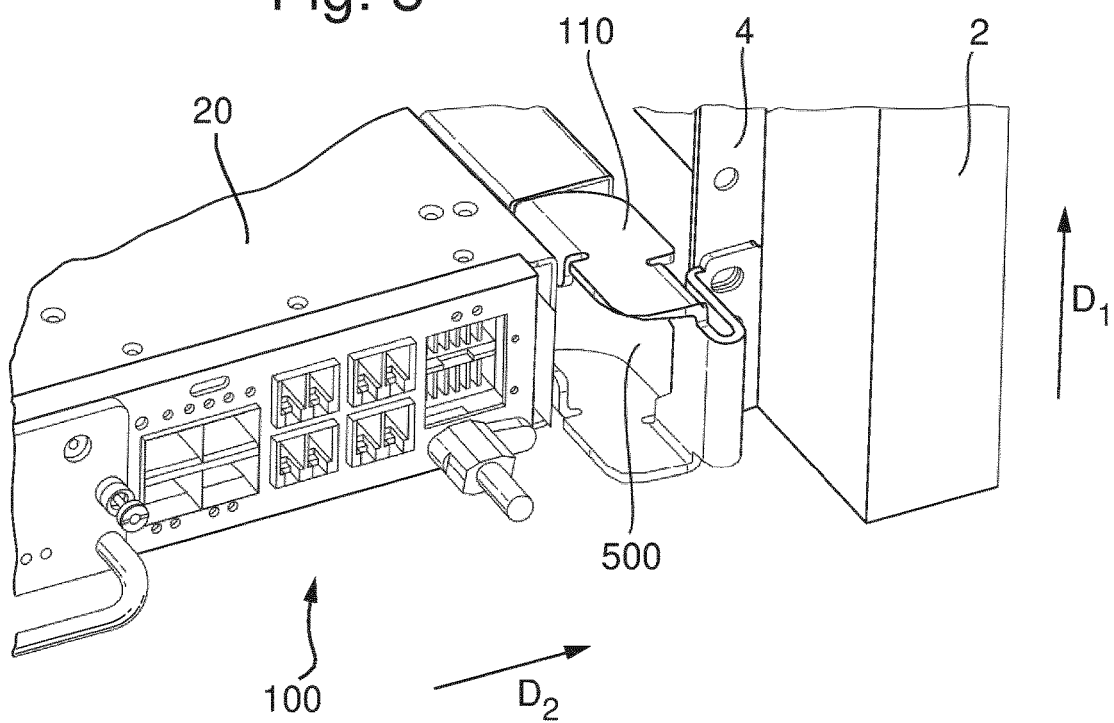
FIG. 5 is a partial front perspective view of the device mounting system and device rack shown in FIG. 4.

With reference to FIGS. 4 and 5, a device mounting system 100 according to the present disclosure provides alternative arrangements for mounting an electronic device, such as the rack mountable electronic device 20, on a device rack, such as the standard device rack 2, and for facilitating the organisation and stabilisation of cables and/or fibres connected to the electronic device, such that a dimension of the device mounting system 100 in a first direction $D_1$ of the device mounting system is reduced compared to previously proposed arrangements.

As depicted, the device mounting system 100 comprises the electronic device 20 and one or more brackets 110, according to the present disclosure. In particular, one bracket 110 may be coupled to either lateral side of the electronic device 20. As shown in FIGS. 4 and 5, the bracket 110 may define an opening 500 that is disposed to the side of the electronic device 20 in the second direction $D_2$ for cables and/or fibres to be routed into the cable routing areas 8 of the device rack 2. As shown, the opening 500 may be (at least partially) aligned with the electronic device 20 in the first direction $D_1$. In other words, a dimension of the opening 500 in the first direction $D_1$ may overlap with a dimension of the electronic device 20 in the first direction $D_1$.

Figure 6A:
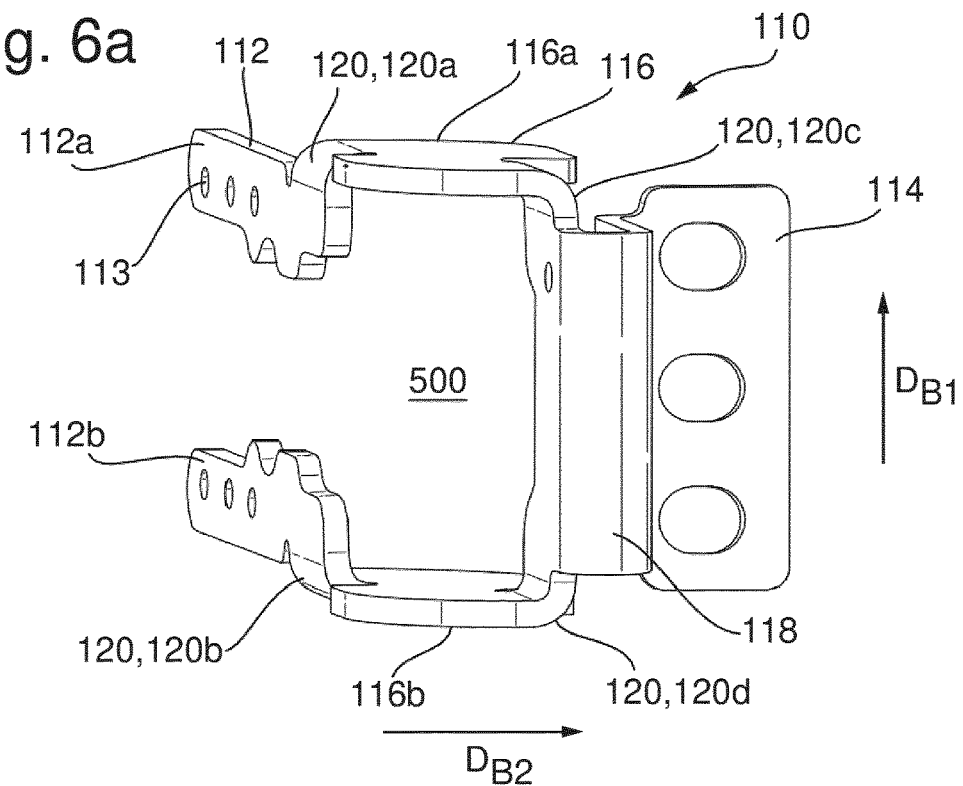
FIGS. 6a and 6b, collectively referred to as FIG. 6, are perspective views of a bracket for the device mounting system shown in FIGS. 4 and 5.
Figure 6B:
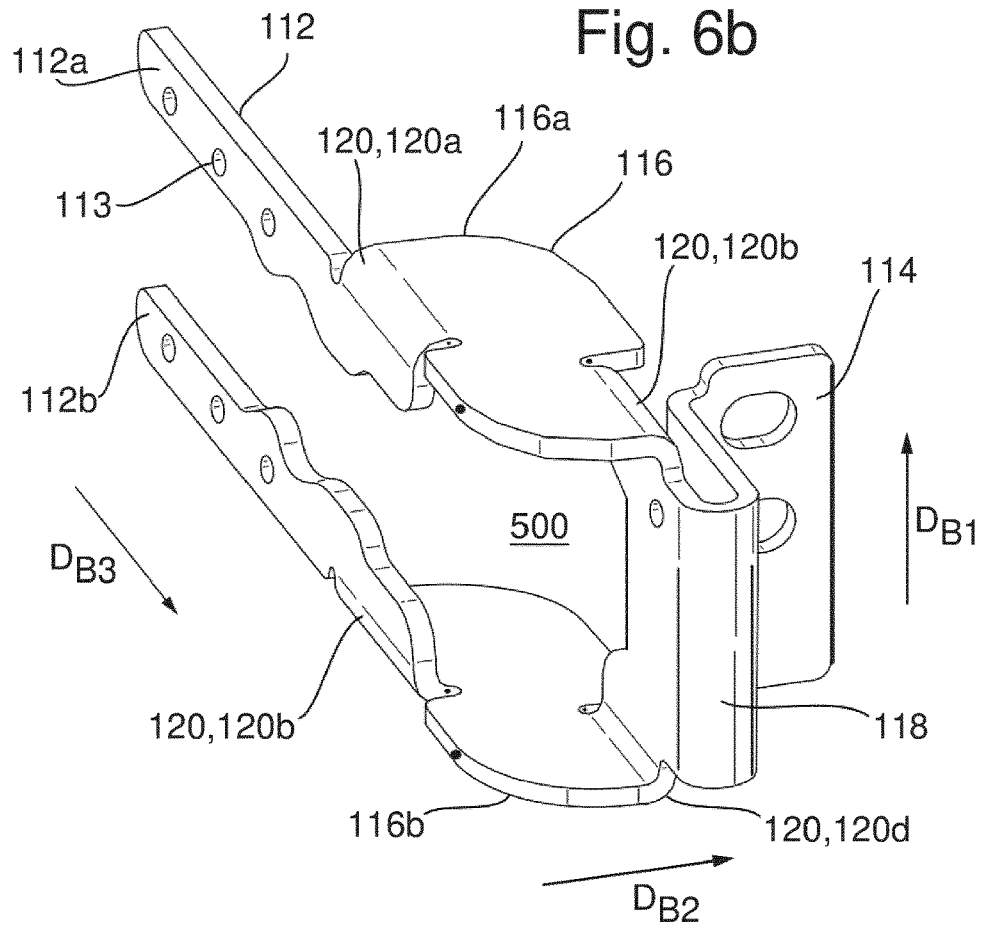

With reference to FIGS. 6a and 6b, the bracket 110, according to arrangements of the present disclosure, comprises a first coupler 112 for coupling the bracket to the electronic device 20, a second coupler 114 for coupling the bracket to the device rack 2, e.g. to the coupling points 6 on the device rack, and a bracket body 116 extending between the first and second couplers 112. As shown, the bracket body 116 may extend between the first and second couplers 112, 114 in a second (lateral) direction of the bracket $D_{B2}$, e.g. that is aligned with the second direction $D_2$ when the bracket is provided within the device mounting system 100.

A dimension of the bracket body 116, or a sum of the dimensions of portions of the bracket body, in a first direction $D_{B1}$ of the bracket, e.g. which is aligned with the first direction $D_1$ of the device mounting system 100 when the bracket 110 is provided within the device mounting system, may be less than a dimension of at least one of the first and second couplers 112, 114 in the first direction $D_{B1}$, so that the opening 500 is formed between the first and second couplers (in the second direction of the bracket), the opening 500 having a dimension in the first direction $D_{B1}$ that is at least partially aligned or overlapping with a dimension of the first and/or second couplers 112, 114 in the first direction $D_{B1}$.

In the arrangement shown in FIGS. 6a and 6b, the bracket body 116 comprises first and second arms 116a, 116b spaced apart in the first direction $D_{B1}$ of the bracket, and the opening 500 is defined between the first and second arms of the bracket body. The first and second arms 116a, 116b may comprise plates disposed in planes perpendicular to the first direction $D_{B1}$ of the bracket 110.

The first coupler 112 may comprise a flange. The flange may be disposed in a plane parallel with the first direction $D_{B1}$. As Illustrated, the plane of the first coupler flange may be perpendicular to the second direction $D_{B2}$. However, in other arrangements the plane of the first coupler flange may be perpendicular to a direction at an angle relative to the second direction $D_{B2}$. The first coupler may comprise one or more fastener openings 113 for receiving fasteners to couple the bracket to the electronic device 20. In other arrangements, the first coupler may comprise any other features for coupling to the electronic device 20.

As depicted, in some arrangements, the first coupler 112 may comprise two or more separate coupler portions 112a, 112b. The coupler portions 112a, 112b may be spaced apart from one another in the first direction $D_{B1}$ of the bracket. The separate coupler portions 112a, 112b may be connected to different respective portions of the bracket body 116. For example, as shown in FIGS. 6a and 6b, a first coupler portion 112a is coupled to the first arm 116a and a second coupler portion 112b is coupled to the second arm 116b of the bracket body. This arrangement may increase, e.g. maximise, a flow area for inlet and/or outlet airflow from and/or to the electronic device 20. For example, a flow area for inlet and/or outlet airflow from and/or to the electronic device may be proved at least partially between the coupler portions 112a, 112b.

The second coupler 114 may comprise a flange, which may be disposed in a plane parallel with the first direction $D_{B1}$. As Illustrated, the plane of the second coupler flange may be perpendicular to a third direction $D_{B3}$ perpendicular to the first and second direction $D_{B1}$, $D_{B2}$. The plane of the second coupler flange may be perpendicular to the plane of the first coupler flange. However, in other arrangements the plane of the second coupler flange may be perpendicular to a direction at an angle relative to the third direction $D_{B3}$, e.g. such that the plane of the second coupler flange is at another angle relative to the plane of the first coupler flange. The relative arrangements of the first and second flanges may be determined based on the dimensions of the electronic device 20 and the device rack 2. The second coupler may comprise one or more fastener openings 115 for receiving fasteners to couple the bracket to the device rack 2. In other arrangements, the second coupler may comprise any other features for coupling to the device rack 2.

As illustrated in FIG. 5 and FIG. 6b, a portion of the bracket body 116 may extend beyond, or to one side, e.g. forwards, of the first and second couplers 112, 114 in the third direction $D_{B3}$. As shown, the portions of the bracket body having a dimension in the first direction $D_{B1}$ of the bracket that is less than the dimension of at least one of the first and second couplers 112, 114 in the first direction $D_{B1}$ may extend to the one side of the first and second couplers 112, 114 in the third direction $D_{B3}$. For example, the first and second arms 116a, 116b of the bracket body 116 may extend to the one side of the first and second couplers 112, 114 in the third direction $D_{B3}$. In this way, a maximum dimension of the opening 500 through which the cables and/or fibres may be routed from the electronic device may be increased.

The bracket body 116 may connect the first and second couplers 112, 114 such that a structural load path defined by the bracket body 116 between the first and second couplers 112, 114 extends beyond the one side, e.g. forwards, of the first and second couplers in the third direction $D_{B3}$. In other words, there may be no load path provided by the bracket body 116 between the first and second couplers 112, 114 that does not extend beyond the one side of the first and second couplers in the third direction.

The bracket body may comprise a vibration damping portion 118. The vibration damping portion may be configured, e.g. shaped, to damp vibrations of the electronic device 20 relative to the device rack 2 and/or to reduce the amplitude of loads, e.g. alternating loads, transmitted from the electronic device 20 to the device rack 2 when the electronic device 20 is vibrating relative to the device rack in the second direction $D_{B2}$ and/or the third direction $D_{B3}$. In the same way, the vibration damping portion may be configured, e.g. shaped, to damp vibrations of the device rack 2 relative to the electronic device 20 and/or reduce the amplitude of loads, e.g. alternating loads, transmitted from the device rack 2 to the electronic device 20, e.g. when the device rack is vibrating relative to the electronic device in the second direction and/or the third direction.

The vibration damping portion 118 may form part of the structural load path formed by the bracket body 116 between the first and second couplers 112, 114. The vibration damping portion 118 of the bracket body may extend beyond the one side, e.g. forwards, of the first and second couplers in the third direction $D_{B3}$.

As shown in FIG. 6b, the vibration damping portion 118 may comprise a portion of the bracket body having a curved profile in a cross-section in a plane perpendicular to the first direction $D_{B1}$. The vibration damping portion 118 of the bracket body may extend through an angle of greater than 90 degrees. For example, the portion of the bracket body may extend through approximately 180 degrees. As illustrated, a radius of curvature of the vibration damping portion 118 may be less than a length of the vibration damping porting in the third direction $D_{B3}$, e.g. a length of the vibration damping porting that extends to the one side of the first and second couplers 112, 114 in the third direction $D_{B3}$.

The bracket body may further comprise one or more further vibration damping portions 120 configured, e.g. shaped to damp vibrations of the electronic device relative to the device rack 2 in the first direction $D_{B1}$ and/or reduce the amplitude of loads, e.g. alternating loads, transmitted from the electronic device 20 to the device rack 2 when the electronic device is vibrating relative to the device rack in the first direction $D_{B1}$. In the same way, the further vibration damping portions may be configured, e.g. shaped, to damp vibrations of the device rack 2 relative to the electronic device 20 and/or reduce the amplitude of loads, e.g. alternating loads, transmitted from the device rack 2 to the electronic device 20, e.g. when the device rack is vibrating relative to the electronic device in the first direction.

The further vibration damping portions 120 may comprise one or more portions of the bracket body 116 having a curved profile in a cross-section in a plane parallel with the first direction. For example, the further vibration damping portions 120 may have a curved profile in a cross-section in a plane perpendicular to the third direction $D_{B3}$.

In some arrangements, the first coupler 112 may be connected to the bracket body 116 by one or more of the further vibration damping portions 120. For example, the first coupler 112 may be connected to the first arm 116a by a first further vibration damping portion 120a and the first coupler 112 may be connected to the second arm 116b by a second further vibration damping portion 120b.

In the arrangement shown in FIGS. 5 and 6, the first and second arms 116a, 116b of the bracket body are connected to the vibration damping portion 118 by third and fourth further vibration damping portions 120c, 120d respectively.

As shown, the first and third further vibration damping portions 120a, 120c may be coupled to opposing sides of the first arm in the second direction $D_{B2}$. The first and third further vibration damping portions 120a, 120c may together extend through an angle of greater than 90 degrees, such as approximately 180 degrees. Similarly, the second and fourth further vibration damping portions 120b, 120d may be coupled to opposing sides of the second arm 116b in the second direction $D_{B2}$. The second and fourth further vibration damping portions 120b, 120d may together extend through an angle of greater than 90 degrees, such as approximately 180 degrees.

In the arrangements shown, the first and third further vibration damping portions 120a, 120c are offset from, e.g. are not aligned with, one another in the third direction $D_{B3}$ of the bracket. Similarly, the second and fourth further vibration damping portions 120b, 120d are offset from, e.g. are not aligned with, one another in the third direction $D_{B3}$ of the bracket. However, in other arrangements, the first and third further vibration damping portions 120a, 120c may be at least partially aligned with one another in the third direction $D_{B3}$ of the bracket. Additionally or alternatively, in other arrangements, the second and fourth further vibration damping portions 120b, 120d may be at least partially aligned with one another in the third direction $D_{B3}$ of the bracket. An amount of offset or alignment of the first and third further vibration damping portions 120a, 120c and the second and fourth further vibration damping portions 120b, 120d may be selected in order to determine a stiffness, e.g. bending stiffness, of the bracket body 116, which may in turn affect the transmission of loads from the electronic device 20 to the device rack 2.

In some arrangements, e.g. in which the bracket body does not comprise the vibration damping portion 118, the first and second arms 116a, 116b may be connected to the second coupler 114 by the third and fourth further vibration damping portions 120c, 120d respectively.

Figure 7:
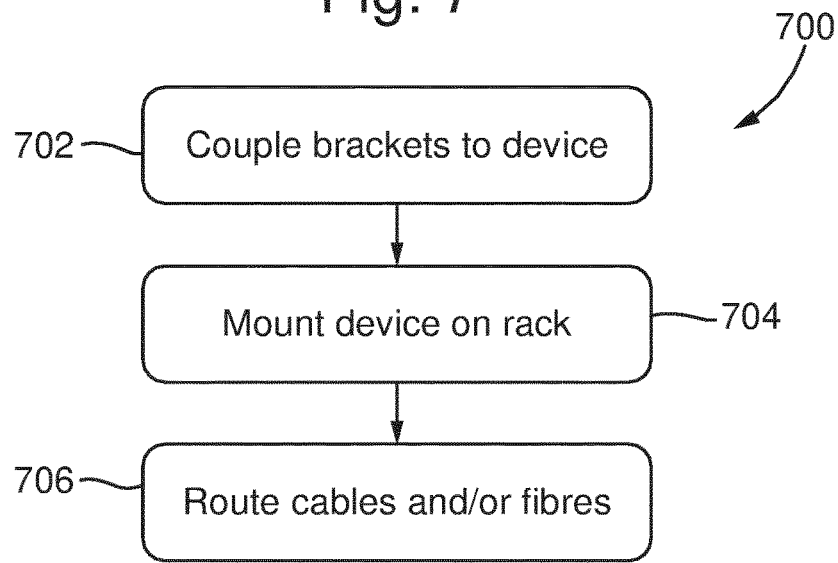
FIG. 7 is a flow chart illustrating a method of fitting an electronic device to a device rack according to the present disclosure.

With reference to FIG. 7, a method 700 of fitting an electronic device, such as the electronic device 20, to a device rack, e.g. a standard device rack 2, according to the present disclosure comprises a first step 702 at which one or more brackets, such as the brackets 110, are coupled to the electronic device 20.

The brackets may comprise a first coupler configured to couple the bracket to the electronic device, a second coupler configured to couple the bracket to the device rack and a bracket body comprising first and second arms extending between the first coupler and the second coupler. The first arms and second arms are spaced apart to define an opening through which one or more cables and/or fibres, e.g. optical fibres, connected to the electronic device can extend. For example, the brackets may comprise the bracket 110 described with reference to FIGS. 4 to 6 above.

The method 700 comprises a second step 704, at which the electronic device 20 is mounted on the device rack 2, e.g. using the brackets. For example, the second couplers of the brackets may be coupled to one or more of the coupling points 6 of the device rack 2.

The method 700 further comprises a third step 706, at which one or more cables and/or fibres are routed from the electronic device 20 through the opening between the first and second arms of one or more of the brackets.

Figure 8:
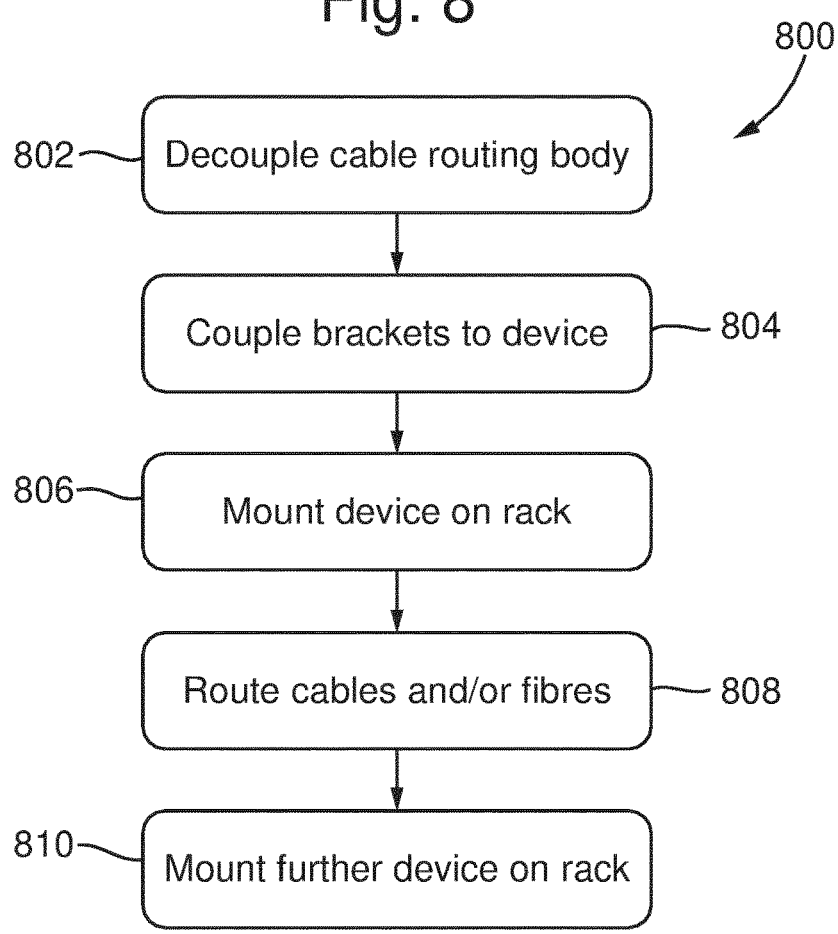
FIG. 8 is a flow chart illustrating another method of fitting an electronic device to a device rack according to the present disclosure.

With reference to FIG. 8, another method 800 of fitting an electronic device, such as the electronic device 20, to a device rack, e.g. a standard device rack 2, will now be described. The method 800 may comprise the method 700, for example, the method 800 may comprise a first step 804, a second step 806 and a third step 808 that are the same as the first, second and third steps 702, 704, 706 of the method 700.

The method 800 may be a method of retrofitting the electronic device 20. In other words, the method 800 may be performed in order to mount the electronic device 20 on the device rack 2 that it is currently or has previously been mounted on, e.g. using one or more alternative components and/or with one or more components being configured in an alternative arrangements. More particularly, the method 800 may be performed in order to remount an electronic device 20 on the device rack 2, such that an amount of space required on the device rack 2 for mounting the electronic device 20 on the device rack and for routing one or more cables and/or fibres to the electronic device is reduced.

Prior to performing the method 800, the electronic device 20 may be mounted on the device rack 2 using, for example, the device mounting system 10 described above with reference to FIGS. 2 and 3. The method 800 may comprise an initial step in which the device mounting system 10 is decoupled from the device rack 2.

The method 800 may comprise a decoupling step 802, at which a cable routing body, such as the cable routing body 40, is decoupled from the electronic device 20. As described above, the cable routing body 40 may be configured to facilitate the routing of cables and/or fibres from the electronic device through a space that is adjacent to the electronic device in the first, e.g. longitudinal, direction $D_1$ of the device mounting system and the device rack (when the device mounting system is coupled to the device rack). Accordingly, by performing the decoupling step 802 and the third step 808, space within the device rack 2 may be freed at a position adjacent to the electronic device in the first, longitudinal, direction.

The method 800 may comprise a further mounting step 810, at which a further electronic device is mounted on the device rack in the space adjacent to the electronic device, e.g. which has been made available by decoupling the cable routing body from the electronic device and routing the cables and/or fibres from the electronic device through the opening between the first and second arms of one or more of the brackets now being used to couple the electronic device 20 to the device rack 2.

Generally, all terms used herein are to be interpreted according to their ordinary meaning in the relevant technical field, unless a different meaning is clearly given and/or is implied from the context in which it is used. All references to a/an/the element, apparatus, component, means, step, etc. are to be interpreted openly as referring to at least one instance of the element, apparatus, component, means, step, etc., unless explicitly stated otherwise. The steps of any methods disclosed herein do not have to be performed in the exact order disclosed, unless a step is explicitly described as following or preceding another step and/or where it is implicit that a step must follow or precede another step. Any feature of any of the embodiments disclosed herein may be applied to any other embodiment, wherever appropriate. Likewise, any advantage of any of the embodiments may apply to any other embodiments, and vice versa. Other objectives, features and advantages of the enclosed embodiments will be apparent from the following description.

It will be appreciated by those skilled in the art that although the invention has been described by way of example, with reference to one or more exemplary examples, it is not limited to the disclosed examples and that alternative examples could be constructed without departing from the scope of the invention as defined by the appended claims.

The invention claimed is:

1. A system for mounting an electronic device on a device rack, wherein the device rack is for supporting a plurality of the electronic devices spaced along the rack in a first direction of the system, wherein the system comprises:
the electronic device; and
a bracket for mounting the electronic device in the device rack, the bracket comprising:
a first coupler configured to couple the bracket to the electronic device;
a second coupler configured to couple the bracket to the device rack; and
a bracket body comprising:
a first arm extending between the first coupler and the second coupler; and
a second arm extending between the first coupler and the second coupler,
wherein the first arm and second arm are spaced apart to define an opening through which one or more cables and/or fibers connected to the electronic device can extend.

2. The system of claim 1, wherein the first and second arms are spaced apart from one another in the first direction, wherein the opening is formed between the first and second arms.

3. The system of claim 1, wherein the first and second arms comprise plates disposed in one or more planes that are perpendicular to the first direction.

4. The system of claim 1, wherein:
the bracket body extends between the first and second couplers in a second direction perpendicular to the first direction,
a portion of the bracket body extends beyond one side of the first and second couplers in a third direction of the system, and
the third direction is perpendicular to the first and second direction.

5. The system of claim 4, wherein the first and second arms of the bracket body extend beyond the one side of the first and second couplers in the third direction.

6. The system of claim 4, wherein the bracket body is connected to the first and second couplers such that a structural load path defined by the bracket body between the first and second couplers extends beyond the one side of the first and second couplers in the third direction.

7. The system of claim 1, wherein the bracket body comprises a vibration damping portion for damping vibrations of one or more of the following: the electronic device relative to the device rack, and the device rack relative to the electronic device.

8. The system of claim 7, wherein the vibration damping portion comprises a portion of the bracket body having a curved profile in a cross-section in a plane perpendicular to the first direction.

9. The system of claim 1, wherein:
the bracket body comprises one or more further vibration damping portions for damping vibrations of one or more of the following: the electronic device relative to the device rack in the first direction, and the device rack relative to the electronic device in the first direction; and the further vibration damping portion comprises one or more portions of the bracket body having a curved profile in a cross-section in a plane parallel with the first direction.

10. The system of claim 1, wherein the first coupler comprises separate first and second coupler portions for coupling to the electronic device at positions spaced apart from one another in the first direction.

11. The system of claim 10, wherein the first coupler portion is connected to the first arm and the second coupler portion is connected to the second arm.

12. A bracket for mounting an electronic device on a device rack, the bracket comprising:
   a first coupler configured to couple the bracket to the electronic device;
   a second coupler configured to couple the bracket to the device rack; and
   a bracket body comprising:
      a first arm extending between the first coupler and the second coupler; and
      a second arm extending between the first coupler and the second coupler,
      wherein the first arm and the second arm are spaced apart to define an opening through which one or more cables and/or fibers connected to the electronic device can extend.

13. The bracket of claim 12, wherein the first and second arms are spaced apart from one another in the first direction, wherein the opening is formed between the first and second arms.

14. The bracket of claim 12, wherein the first and second arms comprise plates disposed in one or more planes that are perpendicular to the first direction.

15. The bracket of claim 12, wherein:
   the bracket body extends between the first and second couplers in a second direction perpendicular to the first direction,
   a portion of the bracket body extends beyond one side of the first and second couplers in a third direction of the system, and
   the third direction is perpendicular to the first and second direction.

16. The bracket of claim 15, wherein the first and second arms of the bracket body extend beyond the one side of the first and second couplers in the third direction.

17. The bracket of claim 15, wherein the bracket body is connected to the first and second couplers such that a structural load path defined by the bracket body between the first and second couplers extends beyond the one side of the first and second couplers in the third direction.

18. A method of fitting an electronic device on a device rack, wherein the method comprises:
   coupling a bracket to the electronic device, wherein the bracket comprises:
      a first coupler configured to couple the bracket to the electronic device;
      a second coupler configured to couple the bracket to the device rack; and
      a bracket body comprising:
         a first arm extending between the first coupler and the second coupler, and
         a second arm extending between the first coupler and the second coupler,
         wherein the first arm and the second arm are spaced apart to define an opening;
   mounting the electronic device on the device rack using the second coupler of the bracket; and
   routing one or more cables and/or fibers to be connected to the electronic device through the opening defined by the first and second arms of the bracket.

19. The method of claim 18, wherein:
   the method is a method of retrofitting the electronic device on the device rack;
   the device rack is for supporting a plurality of the electronic devices spaced along the rack in a first direction; and
   the method further comprises decoupling a cable routing body from the electronic device, the cable routing body defining an opening for routing cables and/or fibers through a space offset from the electronic device in the first direction.

20. The method of claim 19, further comprising mounting a further electronic device on the device rack, such that the further electronic device is at least partially within the space offset from the electronic device in the first direction.

* * * * *